United States Patent [19]
Boyd et al.

[11] Patent Number: 5,746,434
[45] Date of Patent: May 5, 1998

[54] CHAMBER INTERFACING O-RINGS AND METHOD FOR IMPLEMENTING SAME

[75] Inventors: Trace L. Boyd, San Jose; Richard D. Beer, Sunnyvale; Eric A. Terbeek, Fremont; Vernon W. H. Wong, Mountain View, all of Calif.

[73] Assignee: Lam Research Corporation, Fremont, Calif.

[21] Appl. No.: 675,994

[22] Filed: Jul. 9, 1996

[51] Int. Cl.$^6$ .................................................. F16J 15/02
[52] U.S. Cl. .................. 277/1; 277/12; 277/189; 414/217; 414/939
[58] Field of Search .................. 277/1, 12, 35, 277/168, 181, 189; 118/719; 204/298.25; 414/217, 221, 937, 939; 49/463, 466, 495.1

[56] References Cited

U.S. PATENT DOCUMENTS

| | | | |
|---|---|---|---|
| 3,789,875 | 2/1974 | McGee | 137/553 |
| 4,340,462 | 7/1982 | Koch. | |
| 4,355,937 | 10/1982 | Mack et al. | 414/939 |
| 4,433,951 | 2/1984 | Koch et al.. | |
| 4,483,654 | 11/1984 | Koch et al.. | |
| 4,593,915 | 6/1986 | Seger et al. | 277/12 |
| 4,721,282 | 1/1988 | Shawver et al.. | |
| 4,753,417 | 6/1988 | Madocks et al. | 251/158 |
| 4,795,299 | 1/1989 | Boys et al. | 414/939 |
| 4,804,086 | 2/1989 | Grohrock | 414/939 |
| 4,917,556 | 4/1990 | Stark et al. | 414/939 |
| 5,002,255 | 3/1991 | Sawa et al. | 251/193 |
| 5,120,019 | 6/1992 | Davis, Jr. | 251/193 |
| 5,150,882 | 9/1992 | Kaneko | 251/193 |
| 5,383,338 | 1/1995 | Bowsky et al. | 62/125 |

FOREIGN PATENT DOCUMENTS

| | | | |
|---|---|---|---|
| 1093854 | 11/1983 | U.S.S.R. | 251/158 |

*Primary Examiner*—Scott Cummings
*Attorney, Agent, or Firm*—Hickman Beyer & Weaver

[57] ABSTRACT

Disclosed is a method for implementing a vacuum seal between an interface of a transport chamber interface port of a transport chamber and another chamber. The transport chamber being configured to mate with the another chamber in an adjacent relationship. The method includes placing an insert plate having a sealing surface containing a first O-ring into the transport chamber interface port such that the first O-ring is sandwiched between the sealing surface and a surface of the another chamber. Therefore, a vacuum seal is achieved between the transport chamber and the another chamber within the transport chamber interface port via the first O-ring.

25 Claims, 6 Drawing Sheets

CHAMBER INTERFACING O-RINGS AND METHOD FOR IMPLEMENTING SAME

BACKGROUND OF THE INVENTION

The present invention relates generally to sealing O-rings, and more particularly, to consumable O-rings used to create vacuum tight seals between transport modules and other interfacing modules.

Transport modules are generally used in conjunction with a variety of substrate processing modules, which may include semiconductor etching systems, material deposition systems, and flat panel display etching systems. Due to the growing demands for cleanliness and high processing precision, there has been a growing need to reduce the amount of human interaction between processing steps. This need has been partially met with the implementation of transport modules which operate as an intermediate handling apparatus (typically maintained at a reduced pressure, e.g., vacuum conditions). By way of example, a transport module may be physically located between one or more clean room storage facilities where substrates are stored, and multiple substrate processing modules where substrates are actually processed, e.g., etched or have deposition performed thereon.

In this manner, when a substrate is required for processing, a robot arm located within the transport module may be employed to retrieve a selected substrate from storage and place it into one of the multiple processing modules. As is well known to those skilled in the art, the use of a transport module to "transport" substrates among multiple storage facilities and processing modules is typically referred to as a "cluster tool architecture."

FIG. 1 depicts a typical cluster tool architecture 100 illustrating the various chambers that interface with a transport module 106. Transport module 106 is shown coupled to three processing modules 108a–108c which may be individually optimized to perform various fabrication processes. By way of example, processing modules 108a–108c may be implemented to perform transformer coupled plasma (TCP) substrate etching, layer depositions, and sputtering. Connected to transport module 106 may a load lock 104 that is implemented to provide substrates to transport module 106.

As illustrated, load lock 104 is coupled to a clean room 102 where substrates may be stored. In addition to being a retrieving and serving mechanism, load lock 104 may also serve as a pressure varying interface between transport module 106 and clean room 102. Therefore, transport module 106 may be kept at a constant pressure (e.g., vacuum), while clean room 102 is kept at atmospheric pressure. However, in order to prevent leakage between modules during pressure varying transitions, various types of O-rings are implemented.

As is well known in the art, conventional O-rings are employed between chambers to assure that vacuum conditions are maintained during a substrate transfer between transport module 106 and processing modules 108a–108c are exposed to various corrosive gas chemistries. Consequently, these O-rings must be replaced periodically in order to maintain proper processing conditions. Unfortunately, the replacement of these types of O-rings may be a time consuming and laborious proposition.

To facilitate the discussion of the problems associated with prior art O-ring replacement methods, FIG. 2 provides a three dimensional perspective of a conventional interfacing arrangement 200 having a valve body 205 positioned between a processing module 108 and a transport module 106. As shown, valve body 205 has a valve drive assembly 206 positioned below valve body 205. Further, valve body 205 may include two interface ports 216 which provide a passage way for substrates to be transported in and out of processing module 108. In addition, valve drive assembly 206 generally includes a number of mechanical interconnections, electrical connections and gas conduit networks designed to raise and lower a shaft 208 which is connected to a gate plate 210.

Shaft 208 and its associated components are discussed in greater detail in U.S. patent application Ser. No. 08/679,357 filed on the same day as the instant application, naming Trace L. Boyd and Martin F. Yeoman as inventors, and entitled "Vacuum Chamber Gate Valve and Method for Making Same." This application is hereby incorporated by reference.

To establish vacuum tight seals between facets 212 of processing module 108 and transport module 106, O-rings 220 may be sandwiched between processing module 108 and transport module 106. Typically, the modules are bolted together, pneumatics (e.g., air supply lines) and gas lines are connected and tested, electrical connections are connected and tested, and computer connections are made to various testing computers running testing software. Thus, when the time comes to replace worn out O-rings 220, transport module 106, processing module 108 and associated connections must be disconnected and then reconnected. In addition to being time consuming, the dismantled procedure generally requires highly trained personnel knowledgeable in the technology. Consequently, the O-ring replacement process typically tends to be expensive, and requires long periods of down time which unfortunately translates into reduced overall throughput.

A further disadvantage associated with the lengthy and costly process of dismantling entire cluster architectures is the risk of generating misalignments of processing module 108 and transport module 106, and warping to valve body 205. By way of example, in order to replace O-ring 221, drive assembly 206 must be removed from valve body 205 by removing a bonnet plate 222, and then disassembling all of the accompanying mechanical interconnections and electrical contacts located inside of valve body 205 and drive assembly 206. Once these items are removed, the structural integrity of valve body 205 tends to be weaker without the internal support.

Consequently, the more frequently O-rings 220 are replaced due to their interaction with the corrosive gas chemistries, the greater the possibility that irreparable warping will be introduced. When this happens, the entire valve body may have to be replaced or faced-off to cure the resulting warping since basic O-ring replacement will not be sufficient to maintain a proper seal.

In view of the forgoing, what is needed is a method for efficiently replacing consumable O-rings between interfacing chambers without having to disassemble entire sections of a cluster architecture. In addition, it would be desirable to replace consumable O-rings rapidly and cost effectively without introducing extended down times which inefficiently reduce throughput.

SUMMARY OF THE INVENTION

The present invention fills this need by providing a method for implementing O-rings between an interface of a transport chamber interface port and a processing chamber or a load lock interface port. The method includes the step of sliding an insert plate having a sealing surface containing a first O-ring, and a meeting surface containing a second O-ring into the transport chamber interface port such that the first O-ring is sandwiched between the sealing surface and a surface of one of a processing chamber and a load lock chamber.

Advantageously, the second O-ring contained in the insert plate provides a receiving surface for a gate plate located within the transport chamber, and when it is determined that the O-rings need replacing, a view port window of the transport chamber is removed to allow access to the interior of the transport chamber. In this manner, the O-rings may be expeditiously replaced without extensive disassembly.

In another embodiment, an apparatus is disclosed having interfacing O-rings between an interface of a first chamber interface port and a second chamber interface port. The apparatus includes an insert plate having a sealing surface containing a first O-ring and a meeting surface containing a second O-ring, the insert plate being positioned within the first chamber interface port such that the first O-ring is sandwiched between the sealing surface and a surface of a second chamber.

These and other advantages of the present invention will become apparent upon reading the following detailed descriptions and studying the various figures of the drawings.

DETAILED DESCRIPTION OF THE PREFERRED EMBODIMENTS

Figure 1:
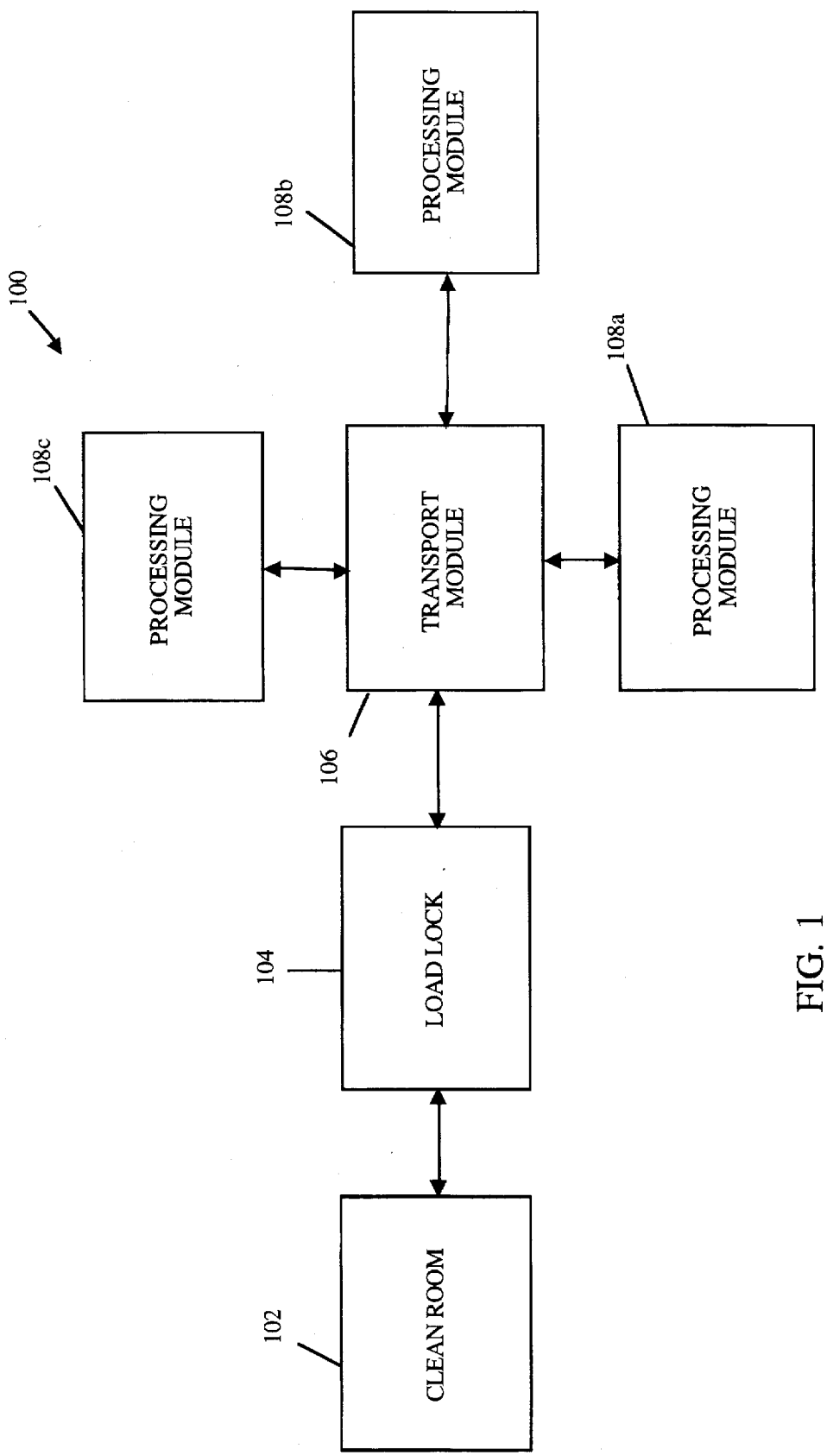
FIG. 1 is diagrammatic illustration of a typical cluster tool architecture which illustrates how various processing modules may be coupled to a transport module.
Figure 2:
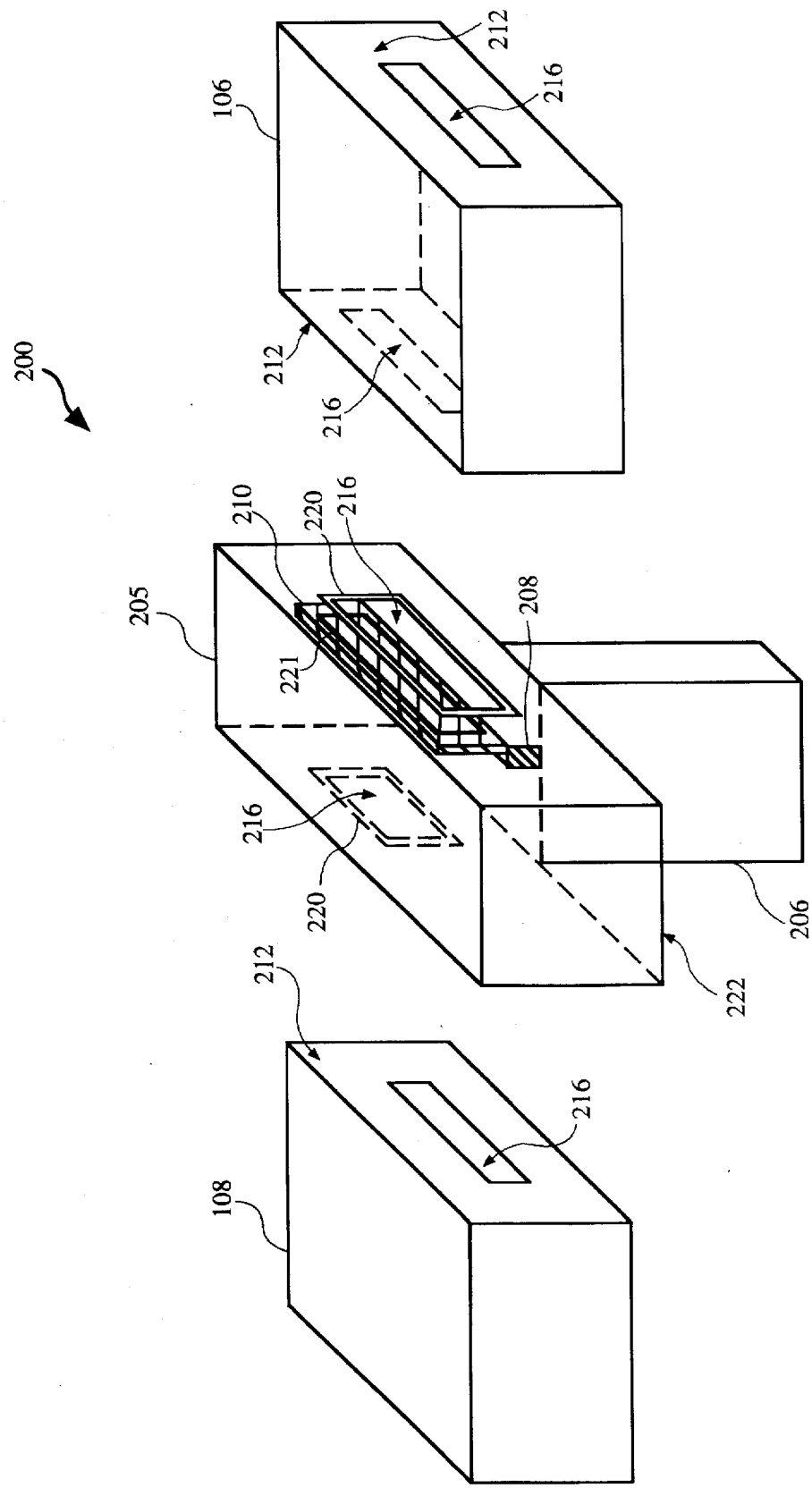
FIG. 2 is a three dimensional perspective of a conventional interfacing arrangement having a valve body positioned between a processing module (or load lock) and a transport module.

As described above, FIG. 1 schematically illustrates a typical cluster tool architecture and the relative positioning of transport module 106. FIG. 2 is a conventional interfacing arrangement used to illustrate various costly disadvantages associated the dismantling cluster architectures in order to replace consumable O-rings.

An invention is described for improving the replaceability of interfacing O-rings. In the following description, numerous specific details are set forth in order to provide a thorough understanding of the present invention. It will be obvious, however, to one skilled in the art, that the present invention may be practiced without some or all of these specific details. In other instances, well known manufacturing steps have not been described in detail in order not to unnecessarily obscure the present invention.

Figure 3:
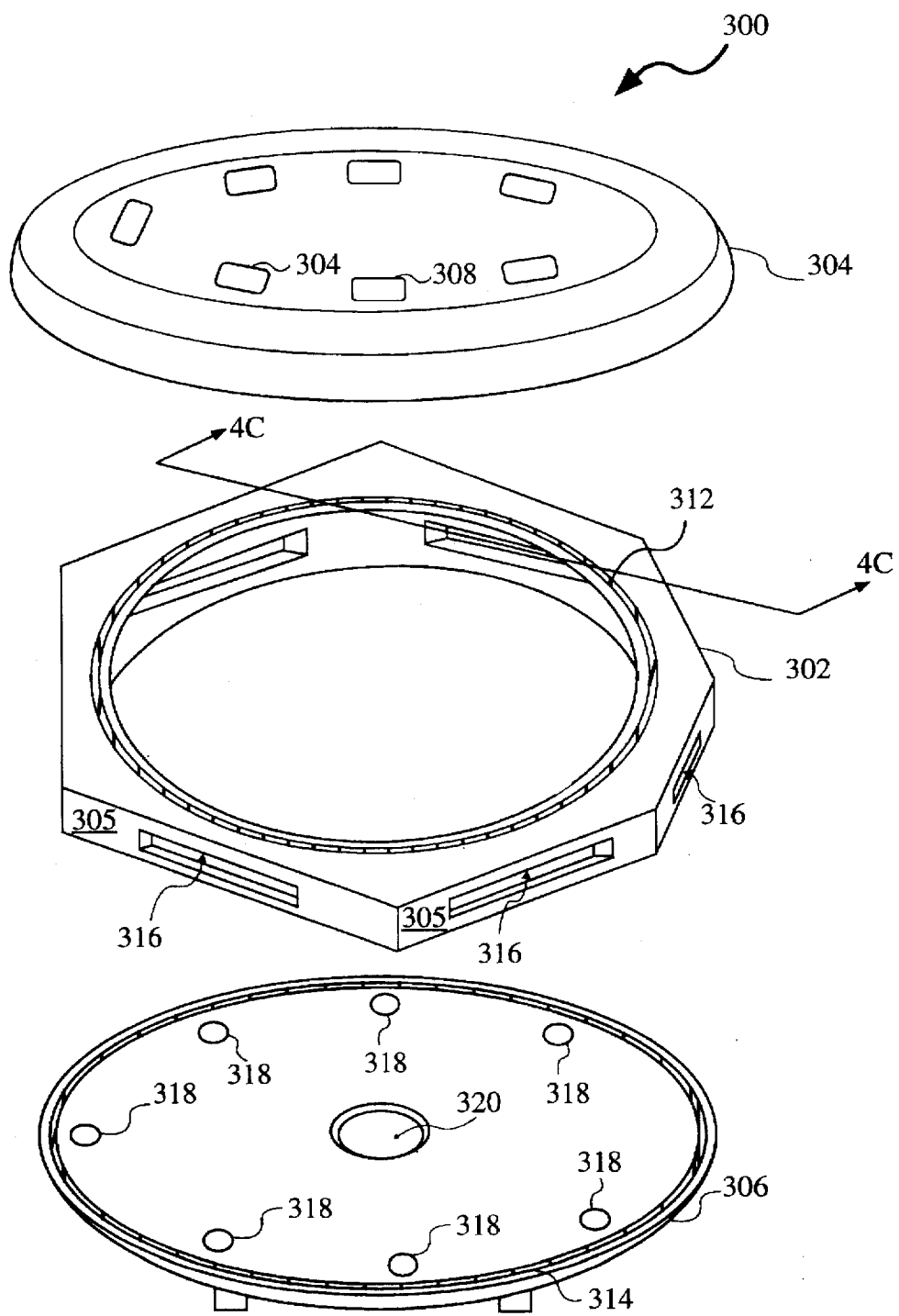
FIG. 3 is an exploded view of a transport chamber which generally includes a chamber housing, a bottom plate, and a top plate all assembled to form a vacuum tight chamber in accordance with one embodiment of the present invention.

To facilitate discussion of one inventive method, FIG. 3 provides an exploded view of a transport chamber 300 which generally includes a chamber housing 302, a bottom plate 306, and a top plate 304 all assembled to form a vacuum-tight chamber. In one embodiment, chamber housing 302 may have any number of facets 305 which provide a surface area for other chambers to meet up against chamber housing 302. In this manner, a vacuum tight seal may be formed between the various processing chambers and load lock chambers interconnected to transport chamber 300 as described in FIG. 1.

In order to insure that an appropriate seal is maintained between transport chamber 300 and other chambers, O-rings are placed between the chamber facets 305 and an abutting chamber. In this manner, a proper seal may be maintained during operation. Further, as described above, at least one facet surface area 305 may be joined up against a load lock unit (e.g., load lock 104 of FIG. 1) to provide a pressure interface between a clean room storage facility and transport chamber 300. Transport chamber 300 may then be maintained at a constant vacuum pressure which eliminates the need to pump down transport chamber 300 each time a new substrate is placed into or out of the chamber. In one embodiment, during processing the pressure inside transport chamber 300 may be maintained between about 1 milliTorr and about 150 milliTorr.

As shown, top plate 304 may sit over a top surface of chamber housing 302, and an O-ring seal 312 is positioned such that a vacuum tight seal is made when top plate 304 is bolted down to chamber housing 302. Similarly, bottom plate 306 may be bolted up against chamber housing 302 such that a vacuum tight seal is made when O-ring seal 314 is positioned between chamber housing 302 and bottom plate 306.

Bottom plate 306 may have, in one embodiment, a robot drive access port 320 designed to allow a robot arm drive (not shown for ease of illustration) to be installed from beneath bottom plate 306. Further, bores 318 are defined around the perimeter of bottom plate 306 in order to provide a passage for inserting a shaft portion of a gate drive unit (not shown for ease of illustration). As is well known in the art, gate drives units are generally used to mechanically open and close a gate up against the various interface ports 316 which may lead to processing chambers, load locks and clean rooms.

Still referring to FIG. 3, top plate 304 is shown having view ports 308 designed to provide viewing and access capabilities into transport chamber 300. By way of example, view ports 308 may provide an efficient passage for installing and replacing consumable O-rings that provide an vacuum seal between a gate drive valve and chambers external to transport chamber 300. As is well known in the art, these consumable O-rings are typically exposed to various contaminating and corrosive gas chemistries which necessitates their periodic replacement. Advantageously, view ports 308 provide an expeditious means for accessing and replacing consumable O-rings without dismantling the entire cluster architecture as will be further described with reference to FIG. 4B below.

Although view ports 308 are shown positioned over each interface port 316, it should be understood that view ports 308 may be optional. If view ports are not included, top plate 304 may easily be removed, in one embodiment, to access the various consumable O-rings. Further, the positioning and shape of view ports 308 may be modified without departing from the spirit and scope of this embodiment.

In one embodiment, view ports 308 may be a clear two inch thick polycarbonate plastic which may be sealed down to top plate 304 by an O-ring. In this manner, a vacuum tight seal may be maintained when transport chamber 300 is brought down to vacuum conditions. In this embodiment, Lexan® plastic which is available from General Electric Plastics of Pittsfield, Mass., may be used to make view ports 308.

For more information on transport chambers and methods for making the same, reference may be made to U.S. patent application Ser. No. 08/677,401 filed on the same day as the instant application, naming Trace L. Boyd and Eric A. Terbeek as inventors, and entitled "Transport Chamber and Method for Making Same." This application is hereby incorporated by reference.

Figure 4A:
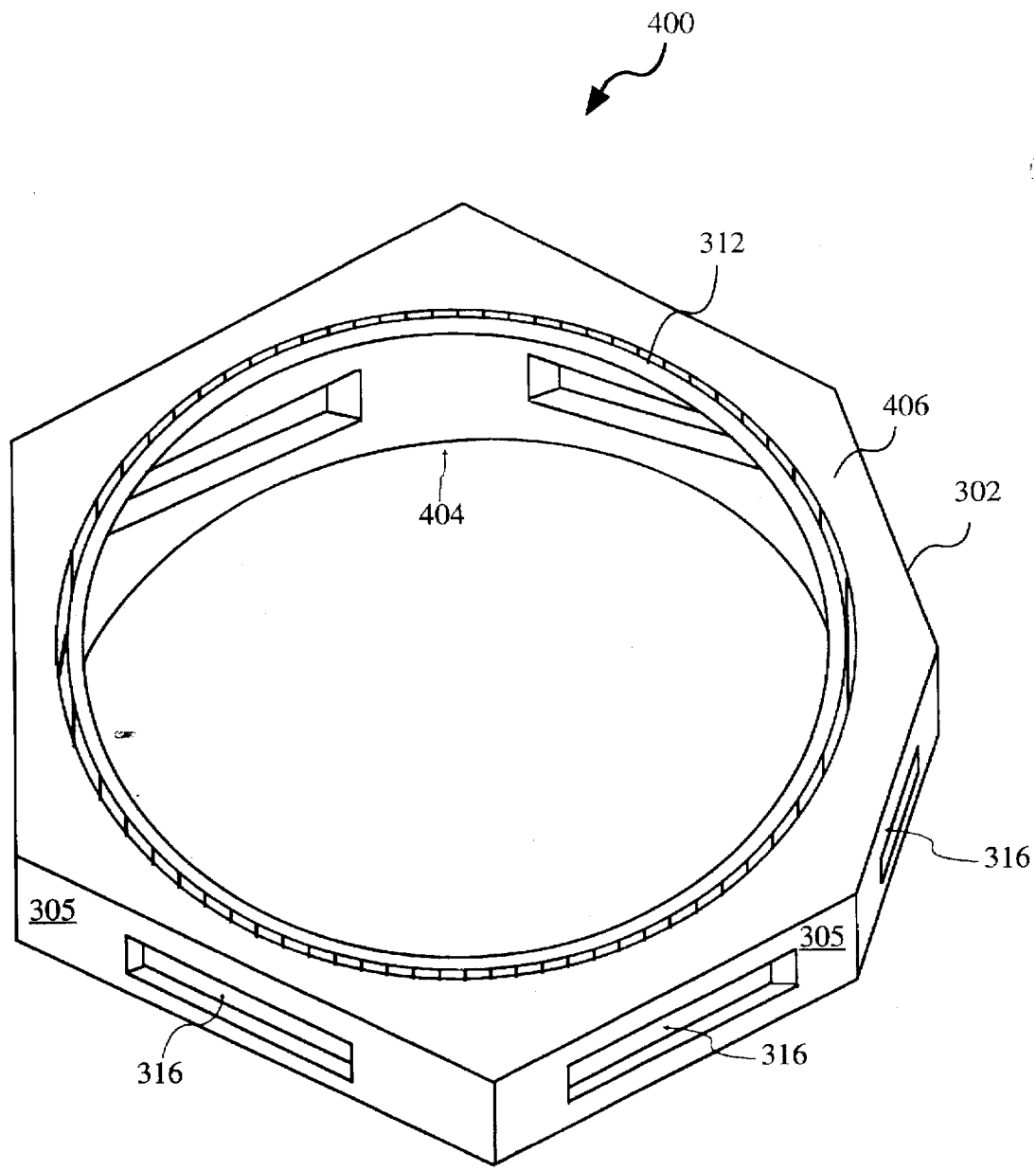
FIG. 4A is a three-dimensional perspective view of a chamber housing showing the interior surface area around interface ports where consumable O-rings and an insert plate are installed in accordance with one embodiment of the present invention.

FIG. 4A is a three-dimensional perspective view of chamber housing 302 which illustrates the interior surface area around interface ports 316 where consumable O-rings and an insert plate may be installed. In this embodiment, top surface 406 is shown having an O-ring seal 312 surrounding the inner perimeter of chamber housing 302. Also, a sealing surface lip 404 is shown to be an underneath surface region of chamber housing 302 which advantageously provides a sealing surface when O-ring seal 314 (of FIG. 3) is sandwiched between bottom plate 306 and chamber housing 302.

Figure 4B:
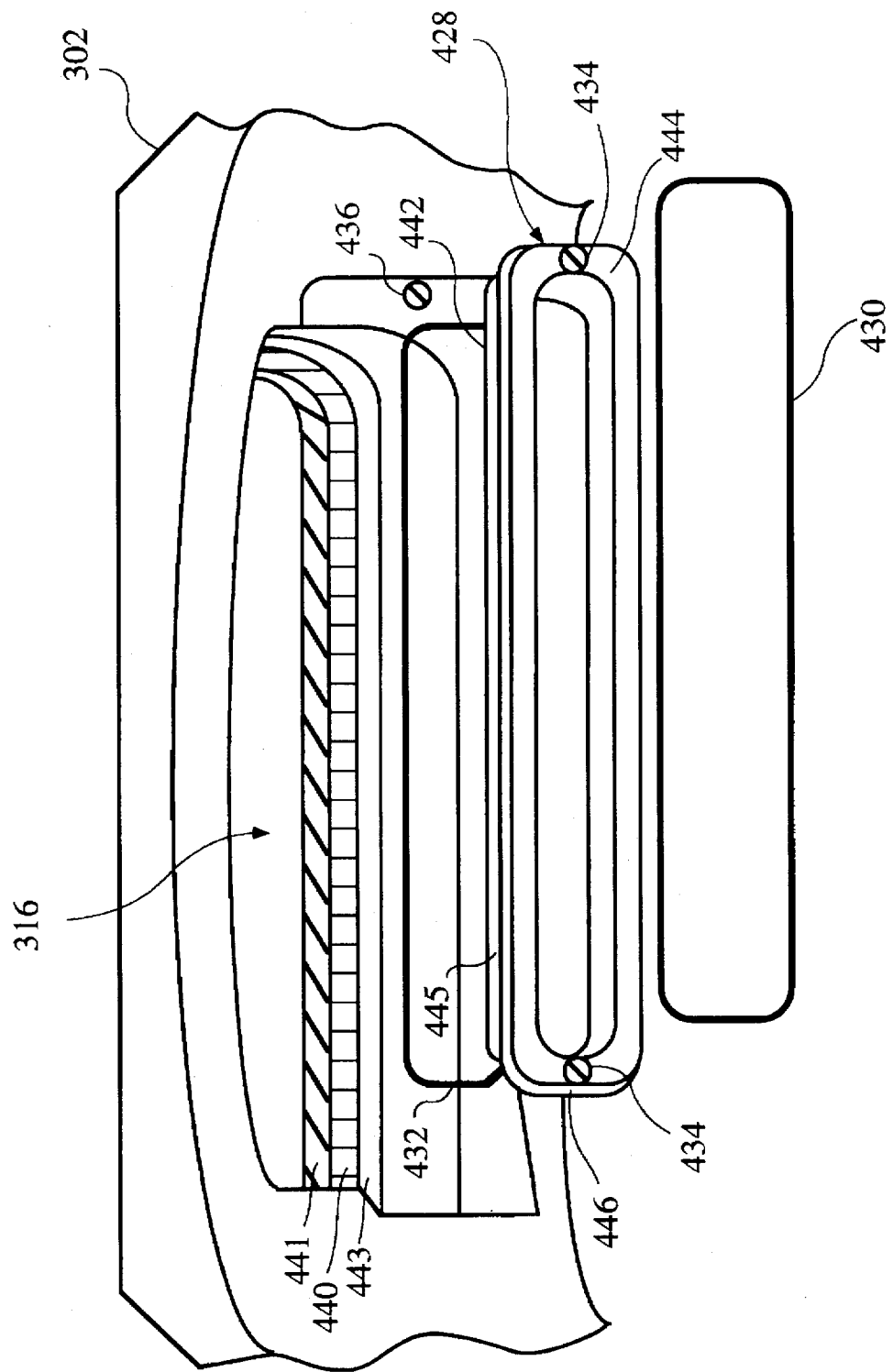
FIG. 4B is an exploded view of an interface port, insert plate and consumable O-ring in accordance with one embodiment of the present invention.

FIG. 4B is an exploded view of an interior region of chamber housing 302. In this embodiment, an exemplar interface port 316 is shown having an interface port lip 440, a first surface 443 and a second surface 441, that in one embodiment are normal to the plane in which interface port lip 440 lies. Therefore, interface port lip 440 may provide the surface on which insert plate 428 may be attached to chamber housing 302. Although insert plate 428 may be attached to chamber housing 302 in any manner, in one embodiment, screws 434 may be used. Furthermore, an inner section 445 of insert plate 428 may be disposed adjacent to a second surface 441, and an outer surface 446 of insert plate 428 may be disposed adjacent to a first surface 443. For ease of understanding, a cross-sectional view will be provided in FIG. 4C below.

Also shown is a sealing surface 442 on insert plate 428 that may contain a consumable O-ring 432 which may be attached to an inset notch defined on sealing surface 442 (not shown). In this manner, sealing surface 442 and consumable O-ring 432 may be handled as "one unit" and O-ring 432 may be compressed up against an interfacing processing module or load lock.

Once consumable O-ring 432 has been attached to sealing surface 442 of insert plate 428, a second consumable O-ring 430 may be attached to an inset notch (not shown) defined on a meeting surface 444 of insert plate 428. In this manner, when a gate plate from the transport chamber side (not shown for ease of illustration) is compressed up against insert plate 428, a vacuum tight seal may be produced. The gate plate and its associated mechanism is described in greater detail in the previously incorporated by reference U.S. patent application Ser. No. 08/679,357. Although any suitable O-ring seal may be used, one preferred consumable O-ring is a metallic seal No. 2-284 available from Parker Seal Group of Lexington, Ky.

As mentioned above, the consumable O-rings are denoted "consumable" since they generally need periodic replacement due to their intimate exposure to processing chemistries. By way of example, once a substrate is placed into a processing chamber by the robot arm of transport chamber 300, the gate plate is compressed against consumable O-ring 430 and insert plate 428 to establish a sealed processing environment. Once the processing (e.g., a plasma etch or deposition) is complete, the gate plate is lowered to allow the robot arm to remove the processed substrate. As can be appreciated, with continued use, the consumable O-rings 432 and 430 may degrade.

Consumable O-rings are typically replaced before leaks begin to impact processing environments. By way of example, when consumable O-rings 432 and 430 no longer provide a vacuum tight seal between transport chamber 300 and exterior processing chambers or load locks, their replacement may be required to maintain proper processing conditions (e.g., typically vacuum conditions). Advantageously, replacement of consumable O-rings 432 and 430 may be accomplished in accordance with the present invention without the dismantling of the entire cluster architecture. As described above, the simple opening of view ports 308 provides the access needed to remove insert plate 428 which frees up consumable O-ring 432 and consumable O-ring 430 which are attached to insert plate 428, e.g., in one embodiment, via the aforementioned notches. Once removed, fresh O-rings may be reinserted as described above without damaging the various interconnecting facilities and alignment of the cluster architecture. For example, fresh O-rings may be attached to the insert plate and the whole insert plate and O-rings unit may then be secured in interface port 316 to achieve a fresh vacuum seal.

Figure 4C:
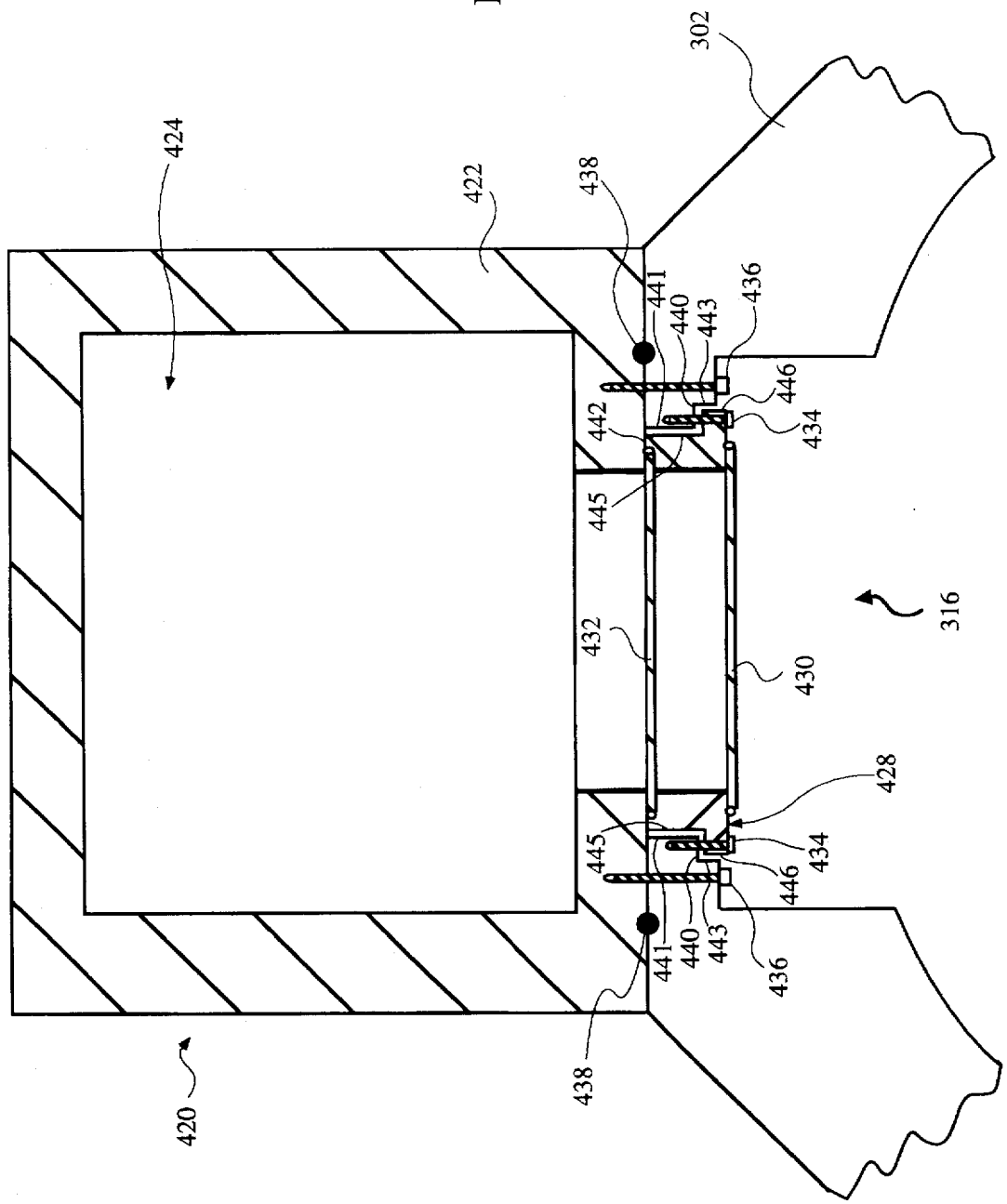
FIG. 4C is a cross-sectional top view of the chamber housing and an abutting processing chamber in accordance with one embodiment of the present invention.

FIG. 4C is a cross-sectional top view of chamber housing 302 and an abutting processing chamber 420 (or load lock chamber). From this perspective, the efficiency by which insert plate 428 may be fastened from the interior of transport chamber 300 may be appreciated. By way of example, when insert plate 428 is disposed in, e.g., slid into interface port 316, consumable O-ring 432 may be sandwiched between a sealing surface 442 of insert plate 428 and the adjacent facet of the processing chamber 420.

In this embodiment, insert plate 428 and its corresponding O-rings may be installed and removed into interface ports 316 through the removal of insert plate 428 which may be fastened to interface port lip 440 through the use of screws 434. For example, screws 434 may pass through insert plate 428 and attach to interface port lip 440. Further, inner section 445 of insert plate 428 may be disposed adjacent to second surface 441, and outer surface 446 of insert plate 428 may be disposed adjacent to first surface 443 of chamber housing 302. In this manner, the outer edges of insert plates 428 may be securely fastened to interface port lip 440.

As shown in FIGS. 4B and 4C, the interface port contains a stepped groove (i.e., interface port lip 440) and insert plate 428 contains a stepped lip (i.e., outer surface 446). Accordingly, once insert plate 428 is placed into interface port 316, the stepped lip of insert plate 428 may be substantially contained within the stepped groove of interface port 316.

In this embodiment, a processing chamber 420 (or load lock) may be attached to a facet of chamber housing 302 through the use of any suitable attaching mechanism. By way of example, screws 436 being vented-type hardware screws having sufficient size and strength to attach processing chamber 420 to chamber housing 302 may be used. In order to further insure that the interface between the chambers produces a vacuum tight sealing surface, an O-ring seal 438 may be placed around the external facet surface area of chamber housing 302. In this manner, interface port 316 is further sealed from external atmospheric conditions while the passage channel formed between processing chamber 420 and transport chamber 300 may be maintained at about vacuum conditions during operation.

It should be appreciated that O-ring seal 438 is generally protected from the corrosive gas chemistries by consumable O-ring 432 and/or consumable O-ring 430 and generally does not need to be replaced. Therefore, the replacement of the consumable O-rings 430 and 432 will advantageously not require the separation of processing chamber 420 from transport chamber 300. As mentioned above, not only is the replacement process rapid and cost efficient, the dangers of misalignment and warping associated with conventional disassembly steps are substantially avoided.

Although the O-ring replacement method described in the various embodiments have direct application to interfaces between transport chambers and processing chambers, it should be borne in mind that these embodiments are equally applicable to any application where the replacement of gasket-type or O-ring type sealing interfaces are essential. In one particular embodiment, the substrates being processed in the processing chambers may be implemented to produce flat panel displays (FPDs) which are typically exposed to number of etching processes within a cluster architecture implementing the aforementioned O-ring sealing methods.

By way of example, the invention may apply to a cluster architecture known by the trademark name "Continuum," and available from Lam Research Corporation of Fremont, Calif. However, it should be understood that the transport chamber 300 and its associated processing modules may be used to fabricate a variety of different articles of manufacture. By way of example, transport chamber 300 may be used to transport semiconductor wafers, disk drives, items needing metal plating or etching. Broadly speaking, the disclosed embodiments may also be used for depositing films, freeze drying foods and any other application implementing a vacuum (which includes low pressure) transport chamber and associated processing modules.

Although the foregoing invention has been described in some detail for purposes of clarity of understanding, it will be apparent that certain changes and modifications may be practiced within the scope of the appended claims. In addition, although the preferred consumable O-ring is a metallic seal, any other suitable sealing material or gasket such as a molded elastomer seal, an extruded elastomer seal, etc., may be substituted therefor. Therefore, the present embodiments are to be considered as illustrative and not restrictive, and the invention is not to be limited to the details given herein, but may be modified within the scope and equivalence of the appended claims.

What is claimed is:

1. A method for implementing a vacuum seal between an interface of a transport chamber interface port of a transport chamber and another chamber, said transport chamber being configured to mate with the another chamber in an adjacent relationship, comprising:

placing an insert plate having a sealing surface containing a first O-ring into the transport chamber interface port such that the first O-ring is sandwiched between the sealing surface and a surface of the another chamber, the insert plate having a stepped lip substantially contained within a stepped groove defined in the transport chamber interface port, and the vacuum seal is achieved between the transport chamber and the another chamber within the transport chamber interface port via the first O-ring.

2. The method of claim 1 wherein the insert plate further includes a meeting surface, the meeting surface containing a second O-ring and providing a receiving surface for a gate plate located within the transport chamber.

3. The method of claim 2 wherein the insert plate, the first O-ring, and the second O-ring are removable as a single unit.

4. The method of claim 2 further including the steps of:
determining whether one of the first O-ring and the second O-ring requires replacement; and
removing the insert plate, the first O-ring, and the second O-ring as one unit through a view port of the transport chamber to facilitate the replacement.

5. The method of claim 4 wherein the first O-ring and the second O-ring are replaced without removing the transport chamber from the another chamber.

6. The method of claim 2 further comprising:
providing a gate drive shaft configured for coupling with the gate plate; and
positioning the gate plate, using the gate drive shaft, against the meeting surface, therefore forming a vacuum seal between the gate plate and the meeting surface.

7. The method of claim 1 wherein the another chamber is selected from the group consisting essentially of a flat panel display processing chamber, a deposition chamber, a disk drive processing chamber, and a semiconductor processing chamber.

8. The method of claim 1 wherein the another chamber is a load lock.

9. The method of claim 8 wherein the load lock is positioned between the transport chamber and a clean room.

10. The method of claim 9 wherein the clean room is at about atmospheric pressure.

11. The method of claim 1 wherein a pressure in the transport chamber is maintained during processing between about 1 milliTorr and about 150 milliTorr.

12. The method of claim 1 further including the step of:
attaching a third O-ring seal around an external facet of the transport chamber interface port to provide a secondary vacuum seal between the transport chamber and the surface of the another chamber.

13. The method of claim 12 wherein the third O-ring is substantially protected from chemistries from the another chamber by the first O-ring, thereby subjecting the third O-ring less degradation than the first O-ring.

14. An apparatus having interfacing O-rings between an interface of a first chamber interface port and a second chamber interface port of a second chamber, the apparatus comprising:

an insert plate having a sealing surface containing a first O-ring and a meeting surface containing a second O-ring, the insert plate having a stepped lip substantially contained within a stepped groove of the first chamber interface port such that the first O-ring is sandwiched between the sealing surface and a surface of a second chamber.

15. The apparatus as recited in claim 14, wherein the first chamber interface port is a transport chamber interface port.

16. The apparatus as recited in claim 15, wherein the second chamber interface port is selected from the group consisting essentially of a processing chamber interface port, a load lock interface port and a clean room interface port.

17. The apparatus as recited in claim 16, further including a third O-ring seal placed around an external facet of the transport chamber interface port to provide a seal between the transport chamber and a facet of the second chamber.

18. The apparatus as recited in claim 16, wherein said first and second O-rings are consumable via exposure to chemistries from the second chamber.

19. The apparatus as recited in claim 16, wherein the processing chambers are selected from the group consisting essentially of flat panel display processing chambers, deposition processing chambers, disk drive processing chambers, and semiconductor processing chambers.

20. A method for implementing a vacuum seal between a transport chamber and another chamber, the transport chamber having an interface port with a stepped groove at a first surface of the transport chamber, the another chamber having a first port disposed at second surface of the another chamber, comprising:

provic ling a first O-ring;

providing a insert plate having a stepped lip, a through hole and a sealing surface, the sealing surface being configured to mate with the first O-ring;

placing the insert plate into the interface port such that the through hole and the second port define a first passageway, the first O-ring being mated with the sealing surface and disposed between the sealing surface and the second surface of the another chamber, and the insert plate being substantially contained within the stepped groove of the interface port;

fastening the insert plate onto the transport chamber, thereby causing the O-ring to be compressed between the sealing surface and the second surface of the another chamber, thereby creating the vacuum seal between the transport chamber and the another chamber.

21. An insert plate having a stepped lip and a through hole for implementing a vacuum seal between a transport chamber and another chamber, the transport chamber having an interface port with a stepped groove at a first surface of the transport chamber, the another chamber having a first port disposed at second surface of the another chamber, comprising:

a sealing surface configured to mate with a first O-ring, the insert plate being substantially contained within the stepped groove of the interface port to define a second passageway via the through hole and the second port, the first O-ring being mated with the sealing surface and disposed between the sealing surface and the second surface of the another chamber when the inserted plate is fitted within the interface port.

22. The apparatus of claim 21 wherein the insert plate further comprising a meeting surface configured for mating with a second O-ring.

23. The apparatus of claim 22 wherein the first O-ring and the second O-ring are at least partially disposed in grooves in the sealing surface and the meeting surface respectively.

24. The apparatus of claim 22 wherein the meeting surface represents a surface for mating with a gate plate located within the transport chamber.

25. A method for implementing a vacuum seal between an interface of a transport chamber interface port of a transport chamber and another chamber, said transport chamber being configured to mate with the another chamber in an adjacent relationship, comprising:

placing an insert plate having a sealing surface containing a first O-ring into the transport chamber interface port such that the first O-ring is sandwiched between the sealing surface and a surface of the another chamber, and the insert plate including a meeting surface, the meeting surface containing a second O-ring and providing a receiving surface for a gate plate located within the transport chamber, and the vacuum seal being achieved between the transport chamber and the another chamber within the transport chamber interface port via the first O-ring;

determining whether one of the first O-ring and the second O-ring requires replacement; and removing the insert plate, the first O-ring, and the second O-ring as one unit through a view port of the transport chamber to facilitate the replacement.

\* \* \* \* \*